May 21, 1968 MICHIRO AOKI ET AL 3,384,791

HIGH FREQUENCY SEMICONDUCTOR DIODE

Filed Sept. 9, 1965 2 Sheets-Sheet 1

INVENTORS
MICHIRO AOKI
NORIYOSHI KITAGAWA
BY
Hopgood & Calimafde
ATTORNEYS

HIGH FREQUENCY SEMICONDUCTOR DIODE

Filed Sept. 9, 1965 2 Sheets-Sheet 2

INVENTORS
MICHIRO AOKI
NORIYOSHI KITAGAWA
BY
Hopgood & Calimafde
ATTORNEYS

United States Patent Office 3,384,791

Patented May 21, 1968

3,384,791
HIGH FREQUENCY SEMICONDUCTOR DIODE

Michiro Aoki and Noriyoshi Kitagawa, Tokyo, Japan, assignors to Nippon Electric Company Limited, Tokyo, Japan, a corporation of Japan Filed Sept. 9, 1965, Ser. No. 486,064
Claims priority, application Japan, Sept. 10, 1964, 39/51,653
1 Claim. (Cl. 317—234)

ABSTRACT OF THE DISCLOSURE

A semiconductor junction device having a reduced high resistivity region area in order to substantially improve the Q value of the device at high frequencies without affecting the other characteristics of the device.

This invention relates to a semiconductor junction element which is capable of improved performance in the ultra high frequency range.

It is an object of the invention to significantly improve the Q of semiconductor junction elements so as to improve their operation at high frequencies.

Figure 1:
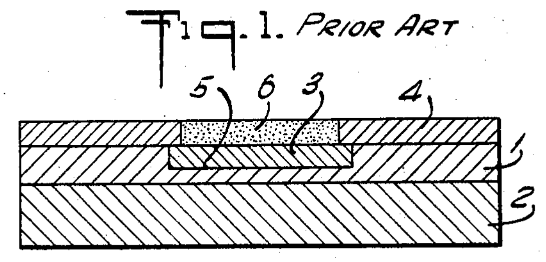
FIG. 1. PRIOR ART
Figure 2:
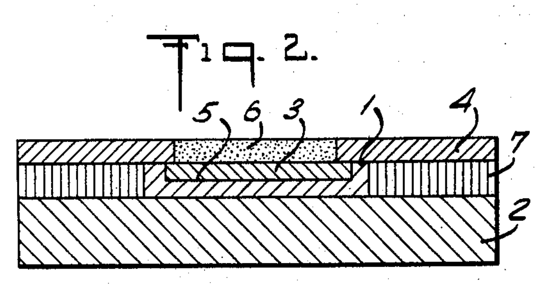
Figure 3:
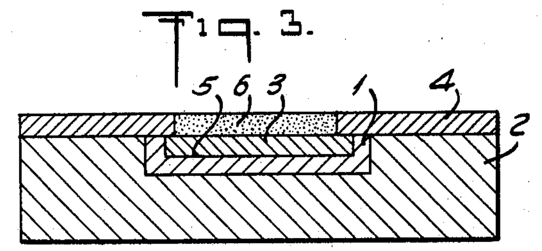
Figure 4:
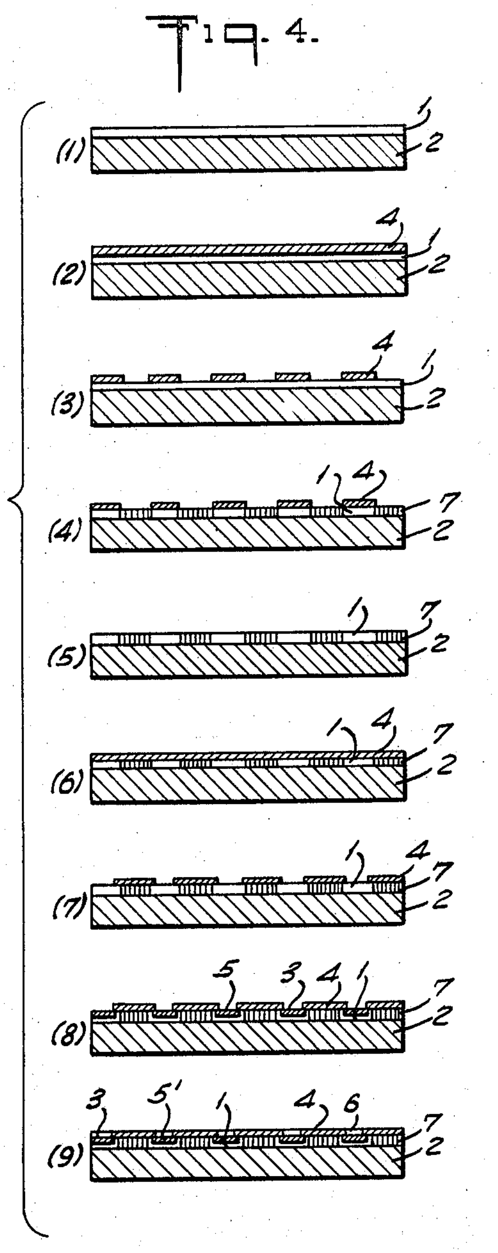
Figures 5, 6:
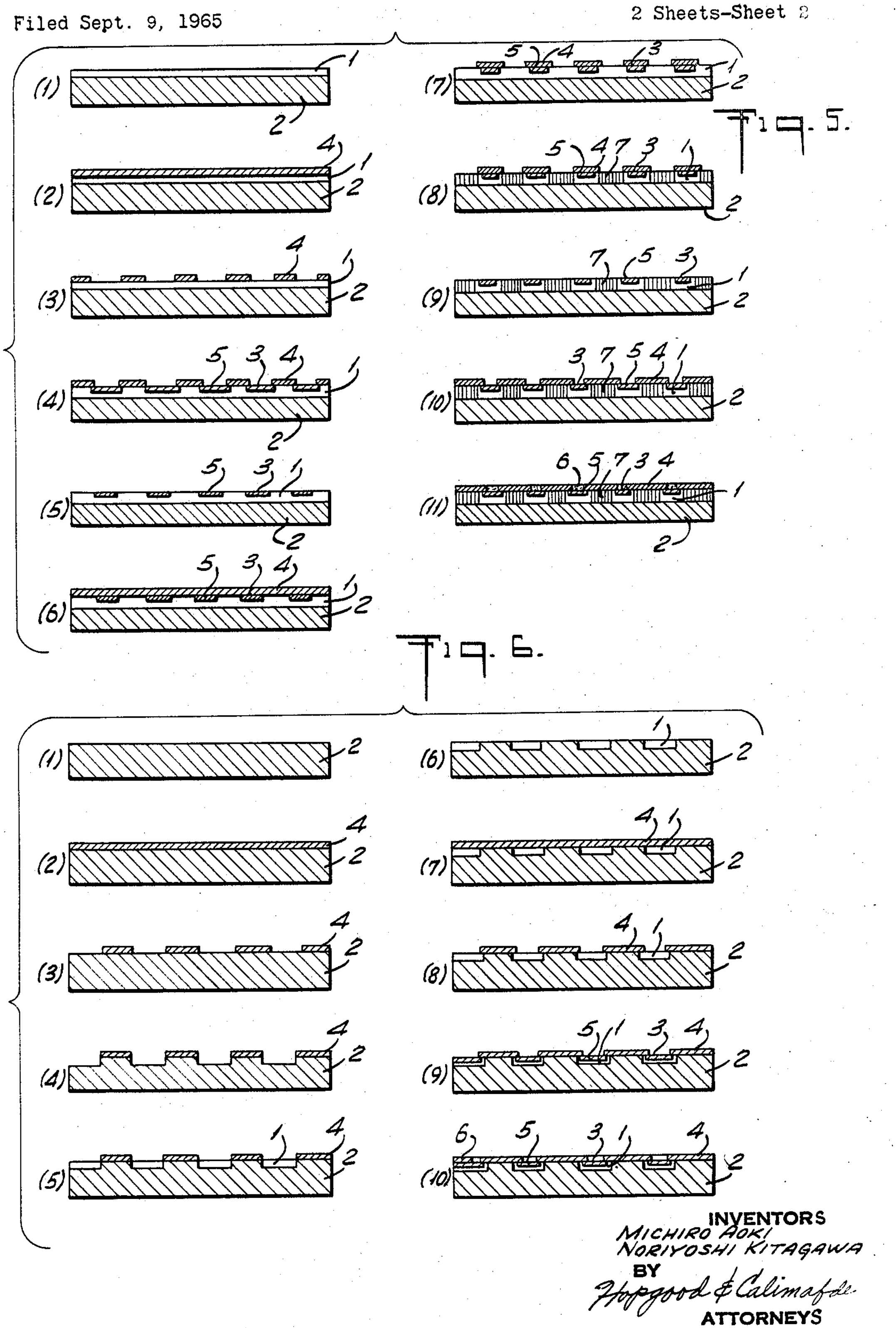

All of the objects, features and advantages of this invention and the manner of attaining them will become more apparent and the invention itself will be best understood by reference to the following description of an embodiment of the invention taken in conjunction with the accompanying drawing, in which:

FIG. 1 is a cross sectional view of a conventional silicon epitaxial planar type diode element, FIGS. 2 and 3 are cross sectional views of the structure of an element made according to the present invention, and FIGS. 4, 5 and 6 illustrate various manufacturing processes for the elements shown in FIGS. 2 and 3.

The present invention will be explained with reference to a diode as an example of a semiconductor junction element for the purpose of simplicity. The advantages of the invention, however, are applicable to other forms of semiconductor devices, as will be apparent to those knowledgeable in the art. For a semiconductor junction diode, the quality factor Q is generally expressed as follows:

$$Q=\frac{1}{\omega C_j R_s}$$

where $\omega$ is the angular frequency, $C_j$ is the junction capacity of a semiconductor junction diode, and $R_s$ is the series resistance of the semiconductor crystal, both $C_j$ and $R_s$ generally being functions of the bias voltage.

It will be appreciated that in order to obtain high Q, at high frequencies, it is necessary to minimize $C_j$ and $R_s$ because $\omega$ is large at such frequencies. $C_j$, however, is not arbitrarily chosen; this is due mainly to problems involved in the circuit design, such as the impedance of the operating circuit, input power, etc. Accordingly, it is most important to minimize the $R_s$ value of the element.

In the conventional ultra high frequency diode, the well known epitaxial growth method has been employed in which, as shown in FIG. 1, a thin semiconductor crystal 1 with a desired resistivity for the particular characteristics of the element, is grown on top of a substrate crystal 2 having an extremely low resistivity, and a p-n junction 5 is formed in the grown region, thus lowering the value of $R_s$.

Further referring to FIG. 1, a silicon dioxide ($SiO_2$) film or layer 4 is grown over the silicon epitaxial crystal, a portion of the oxide film is removed through which the junction will be formed, and an impurity having the opposite conductivity type to that of the crystal 1 is diffused into the crystal through the opening of the oxide film having a masking effect, and forming a region 3 having an opposite conductivity type in the semiconductor crystal.

A semiconductor diode element is produced after an ohmic contact is attached to this region with an appropriate metal film. The characteristics of such an element are very stable, because the p-n junction 5 thus formed at the interface between the regions 1 and 3 is never exposed due to the protection of the oxide film. An element with such a structure is called an epitaxial planar type element, and is known to be most suitable for an ultra high frequency semiconductor junction element.

Although a semiconductor diode having a high Q and stable characteristics may be obtained by adapting the epitaxial planar structure, the value of $R_s$ is not sufficiently small at very high frequencies even in such a structure. This is because current flows only along the surface of an element at high frequencies, this phenomenon being known as skin effect. Accordingly, the contribution of the skin effect to $R_s$ must be taken into account. In the conventional epitaxial planar type element, such as that shown in FIG. 1, the skin effect in the high resistivity region 1 becomes predominant at high frequencies, resulting in a large $R_s$ and poor Q.

An important feature of the present invention is that the portion of the high resistivity region 1 in FIG. 1, which portion is disadvantageous because it causes a low value of Q, is eliminated as much as possible. This results in improvement of the Q at high frequencies without affecting the other various characteristics of the element.

FIG. 2 shows a structure according to one embodiment of the invention wherein an impurity of the same conductivity type as that of the high resistivity region is added to the unnecessary portion of the high resistivity region which portion causes poor Q. As a result, the resistivity of the aforementioned portion is lowered, and thus the high resistivity region 1 necessary for the performance of the element is limited to the region contiguous to the p-n junction 5. In the embodiment of FIG. 3, the high resistivity region 1 is grown on the limited portion of a semiconductor crystal which region has a necessary and sufficient volume for the required performance as an element.

FIG. 4 illustrates various steps in one manufacturing process for the semiconductor junction element shown in FIG. 2. An epitaxial wafer consisting of a high resistivity region 1 and low resistivity region 2 is shown in FIG. 4(1), on which an oxide film 4 is grown as indicated in FIG. 4(2). Portions of the oxide film are removed by photoengraving technique, leaving necessary and sufficient portions of the oxide film in order to form p-n junctions, as shown in FIG. 4(3). An impurity having the same conductivity type as the high resistivity region 1 is then diffused through the openings of the oxide film 4, producing a masking effect, and forming a new low resistivity region 7 in the region 1, as shown in FIG. 4(4). This new region 7 extends to the low resistivity region 2. The oxide film is then entirely removed as shown in FIG. 4(5). A new oxide film 4 is then formed as shown in FIG. 4(6). Selected portions of predetermined area and slope of the oxide film on the high resistivity region are next removed by photoengraving technique in order to form a required p-n junction as shown in FIG. 4(7). An impurity having an opposite conductivity type to that of the high resistivity region 1 is diffused through the openings of the oxide film having a masking effect, a p-n junction 5 being formed at the interface between the regions 1 and 3, as shown in FIG. 4(8). The desired semiconductor element is produced after an ohmic contact is made with a metal film 6, as shown in FIG. 4(9).

FIG. 5 illustrates another manufacturing process for the semiconductor junction element of FIG. 2. FIG. 5(1) shows an epitaxial wafer having a high resistivity region 1 and low resistivity region 2. An oxide film 4 is grown on top of the wafer as shown in FIG. 5(2). Necessary and sufficient portions of the oxide film on the high resistivity region 1 are removed by the photoengraving technique in order to form a p-n junction as shown in FIG. 5(3). An impurity with an opposite type conductivity to that of the high resistivity region 1 is diffused through the openings of the oxide film 4, a p-n junction 5 being formed at the interface between the regions 1 and 3, as shown in FIG. 5(4). The oxide film is then entirely removed as in FIG. 5(5). An oxide film 4 is then again formed as shown in FIG. 5(6). All of the oxide film is removed by the photoengraving technique except the portion covering the p-n junction and the high resistivity region which region is necessary for the performance of the device, and which is contiguous to the junction, as shown in FIG. 5(7). An impurity having the same conductivity type as the high resistivity region 1 is deposited on and alloyed with the region 1 through the openings of the oxide film having a masking effect, a new low resistivity region 7 being thus formed in the region 1, as shown in FIG. 5(8). This new region extends to the low resistivity region 2. The oxide film is entirely removed as shown in FIG. 5(9). In order to protect the p-n junction, the entire surface is covered with an oxide film by the evaporation method except the portion necessary to make an ohmic contact, as shown in FIG. 5(10). The desired semiconductor element is produced after an ohmic contact is made with a metal film 6, as shown in FIG. 5(11).

FIG. 6 illustrates the manufacturing process of the semiconductor junction element of FIG. 3. On a semiconductor substrate crystal with a very low resistivity region 2, as shown in FIG. 6(1), is formed an oxide film 4 as shown in FIG. 6(2). Portions of the oxide film are removed by the photo-engraving technique from the surfaces of portions necessary for the performance of the device, as shown in FIG. 6(3). Recesses are made in these portions by chemical etching as shown in FIG. 6(4). High resistivity regions 1 are grown by the epitaxial growth technique in these recesses as shown in FIG. 6(5). The oxide film is entirely removed as in FIG. 6(6). An oxide film 4 is again grown as illustrated in FIG. 6(7). Removed by photoengraving technique are portions of the oxide film necessary and sufficient for forming a p-n junction in the high resistivity region 1, as in FIG. 6(8). An impurity with an opposite conductivity type to that of the high resistivity region 1 is diffused through the openings of the oxide film having a masking effect, forming the p-n junction 5 at the interface between the regions 1 and 3, as shown in FIG. 6(9). A desired semiconductor element is accomplished after an ohmic contact is made with a metal film 6 as shown in FIG. 6(10).

In all of the above three manufacturing processes, an ohmic contact to the other face of the semiconductor element is usually formed when the element is assembled in a housing. The resistance due to the skin effect and spreading resistance of the semiconductor junction element thus made are sharply reduced because of the conversion of the high resistivity region that is unnecessary for the performance of the element into a low resistivity region.

Some brief description of one experiment performed by the inventors will be of interest. Using a semiconductor crystal specimen having a semiconductor crystal region 1 of 0.6Ω-cm. resistivity and $1.1 \times 10^{-3}$ cm. thickness grown on top of the substrate crystal 2 of 0.002Ω-cm. resistivity, two kinds of semiconductor junction elements were fabricated having the structure shown in FIGS. 1 and 2, each having a p-n junction face of $10^{-2}$ cm. diameter. Comparison of these elements was then made.

Conventionally it has not been possible to obtain a value of Q higher than 4 at 11 gc. and a bias voltage of 6 volts with the conventional structure of FIG. 1. By embodying the present invention in the structure shown in FIG. 2, a Q of 7 at 11 gc. and a bias voltage of 6 volts was obtained, and other tests have proved that none of the other characteristics were adversely affected.

Although the present invention has been explained with specific reference to diodes, as noted above, the invention will be useful with other semiconductor junction elements such as ultra high frequency transistors. Therefore it will be appreciated that variations of the present invention will be apparent to those skilled in the art and that the present invention is to be limited only by the spirit and scope of the appended claim.

What is claimed is:

1. A planar type high frequency semiconductor junction diode comprising:
- a semiconductor substrate crystal of one conductivity and of very low resistivity;
- a high resistivity epitaxial layer of said one conductivity type formed on said substrate, said layer having an upper surface;
- an oxide coating on said surface;
- a first region of opposite conductivity type material extending into said layer from said surface, said region forming a p-n junction with said layer, said p-n junction being spaced a first given distance from said substrate;
- means for reducing the deleterious effects of the skin effect at high frequencies, said means including:
- a second region of low resistivity material of said one conductivity type extending from said surface into and completely through said layer to said substrate, said second region spaced a second given distance outward from said first region along said surface and surrounding said first region, said second region further extending to the outer edge of said layer;
- and said first given distance being substantially equal to said second given distance.

References Cited

UNITED STATES PATENTS

| | | | |
|---|---|---|---|
| 3,242,392 | 3/1966 | Hayashi et al. | 317—234 |
| 3,298,880 | 1/1967 | Takagi et al. | 148—191 |
| 3,341,755 | 9/1967 | Husher et al. | 317—235 |
| 3,261,727 | 7/1966 | Dehmelt et al. | 148—175 |
| 3,260,902 | 7/1966 | Porter | 317—235 |
| 3,243,323 | 3/1966 | Corrigan et al. | 148—175 |
| 3,223,904 | 12/1965 | Warner et al. | 317—235 |

JOHN W. HUCKERT, *Primary Examiner.*

J. R. SHEWMAKER, *Assistant Examiner.*